United States Patent
Lee et al.

(10) Patent No.: US 11,336,076 B2
(45) Date of Patent: May 17, 2022

(54) APPARATUS FOR COMPENSATING PARASITIC IMPEDANCE FOR INTEGRATED CIRCUITS

(71) Applicants: STMICROELECTRONICS (RESEARCH & DEVELOPMENT) LIMITED, Marlow (GB); STMICROELECTRONICS (GRENOBLE 2) SAS, Grenoble (FR)

(72) Inventors: Denise Lee, Edinburgh (GB); Neale Dutton, Edinburgh (GB); Nicolas Moeneclaey, Vourey (FR); Jerome Andriot-Ballet, St Nizier du Moucherotte (FR)

(73) Assignees: STMICROELECTRONICS (RESEARCH & DEVELOPMENT) LIMITED, Marlow (GB); STMICROELECTRONICS (GRENOBLE 2) SAS, Grenoble (FR)

( * ) Notice: Subject to any disclaimer, the term of this patent is extended or adjusted under 35 U.S.C. 154(b) by 303 days.

(21) Appl. No.: 16/743,856

(22) Filed: Jan. 15, 2020

(65) Prior Publication Data
US 2020/0227885 A1    Jul. 16, 2020

(30) Foreign Application Priority Data
Jan. 16, 2019 (EP) .................... 19305053

(51) Int. Cl.
*H01S 5/026* (2006.01)
*H01S 5/042* (2006.01)
*H01S 5/183* (2006.01)

(52) U.S. Cl.
CPC ............ *H01S 5/0261* (2013.01); *H01S 5/042* (2013.01); *H01S 5/183* (2013.01)

(58) Field of Classification Search
CPC ......... H01S 5/0261; H01S 5/042; H01S 5/183
See application file for complete search history.

(56) References Cited

U.S. PATENT DOCUMENTS

| | | | |
|---|---|---|---|
| 7,248,192 B2 | 7/2007 | Gillespie et al. | |
| 9,054,485 B1 | 6/2015 | Ng | |
| 2008/0138089 A1 | 6/2008 | Tokita et al. | |
| 2017/0085057 A1* | 3/2017 | Barnes ................. | H01S 5/0608 |
| 2017/0317665 A1 | 11/2017 | Branca | |

FOREIGN PATENT DOCUMENTS

EP    2 112 727    10/2009

OTHER PUBLICATIONS

Coilcraft, "0603HL (1608) Ceramic Chip Inductors," updated online on Apr. 16, 2018, downloaded from https://www.coilcraft.com/0603hl.cfm on Mar. 10, 2020, 2 pages.

(Continued)

*Primary Examiner* — Yuanda Zhang
(74) *Attorney, Agent, or Firm* — Seed IP Law Group LLP

(57) ABSTRACT

A laser diode driver circuit includes a first pair of contacts and connectors coupled to an anode of the laser diode. An inductance of each of the first pair of contacts and connectors is the same. A second pair of contacts and connectors are coupled to a cathode of the laser diode. An inductance of each of the second pair of contacts and connectors is the same. The laser diode driver circuit also includes current driving circuitry.

20 Claims, 11 Drawing Sheets

(56) References Cited

OTHER PUBLICATIONS

Hegarty, "Reduce buck-converter EMI and voltage stress by minimizing inductive parasitics," *Analog Applications Journal*, AAJ 3Q 2016, pp. 1-7, 2016.
Infineon, "REAL3™ image sensor family, 3D depth sensing based on Time-of-Flight," product brief, Order No. B142-I0200-V1-7600-EU-EC-P, Nov. 2015, 2 pages.
Infineon, "Reference Design Brief CamBoard pico flex," product datasheet, pmdtechnologies gmbh, 2015, 1 page.
Intersil, "800mA Triple Output Laser Diode Driver | ISL58303," product datasheet, FN7555.3, Sep. 2016, 2 pages.
Softkinetic, "DS325 Datasheet, Close interaction time-of-flight 3D depth-sensing camera," product datasheet, Nov. 2016, 2 pages.
Texas Instruments, "Illumination Driving for Tim-of-Flight (ToF) Camera System," product datasheet, SBAA209A, revised Oct. 2016, 17 pages.
Texas Instruments, "OPT8241 3D Time-of-Flight Sensor," product datasheet, OPT8241, revised Oct. 2015, 34 pages.
Texas Instruments, "OPT9221 Time-of-Flight Controller," product datasheet, OPT9221, revised Jun. 2015, 104 pages.

\* cited by examiner

APPARATUS FOR COMPENSATING PARASITIC IMPEDANCE FOR INTEGRATED CIRCUITS

BACKGROUND

Technical Field

Some embodiments relate to an apparatus for compensating parasitic impedance for integrated circuits and in particular but not exclusively to an apparatus for compensating parasitic impedance for integrated circuits for supplying current for laser diodes.

Description of the Related Art

Circuits and methods of driving Laser Diodes (LD) such as vertical cavity surface emitting laser (VCSEL) diodes are known.

An issue with conventional current drivers and laser diode technologies is one of driving current to the laser diode and the inductance produced by the connections between the driver circuitry and the laser diode.

Laser diode driver circuit modules and other circuit modules such as time of flight determination modules are typically mounted as dies on a sub-mount away from the laser diode die. This is done in order to physically, optically and electrically isolate the laser diode as far as possible from other circuitry. Furthermore this allows the production of the laser diode to be fabricated using a first process technology and the driver circuitry and other circuitry using a second process technology, where each process technology is optimized for the respective module.

Connections between modules are then formed by the use of contact pads and bonding wires. These contact pads and bonding wires form parasitic inductances which are significant with respect to the currents (10s-100s A) and pulse widths (2-7 ns with 1 ns rise time) used for example in time of flight range detecting applications.

BRIEF SUMMARY

According to a first aspect, there is provided a laser diode driver circuit comprising: a first pair of contacts and connectors coupled to an anode of the laser diode, wherein an inductance of each of the first pair of contacts and connectors is the same; a second pair of contacts and connectors coupled to a cathode of the laser diode, wherein an inductance of each of the second pair of contacts and connectors is the same; current driving circuitry, wherein the current driving circuitry is configured to operate such that: in a first phase a first current passes through the first pair of contacts and connectors and a further current passes through the a second pair of contacts and connectors such that a potential difference between the cathode and anode is below a diode activation value; in a second phase, succeeding the first phase, the further current passes through a first of the first pair of contacts and connectors, the laser diode and a first of the second pair of contacts and connectors such that the potential difference between the cathode and anode is above the diode activation value; in a third phase, succeeding the second phase, a current passes through a first of the first pair of contacts and connectors, the laser diode and a first of the second pair of contacts and connectors and the potential difference between the cathode and anode is below the diode activation value.

The current driving circuitry may comprise: a first switch configured to selectively couple the first of the first pair of contacts and connectors to a high potential supply node wherein in the first, second and third phase the first switch is configured to couple the first of the first pair of contacts and connectors to a high potential supply node.

The first switch may comprise a pMOS transistor controlled by a safety control signal.

The current driving circuitry may further comprise: a diode with an anode coupled to the second of the first pair of contacts and connectors and a cathode coupled to the high potential supply node; a current source for providing the first current; and a second switch configured to selectively couple the second of the first pair of contacts and connectors to a low potential supply node via the current source, wherein: in the first phase the second switch is configured to couple the second of the first pair of contacts and connectors to a low potential supply node via the current source so that the first current passes through the first pair of contacts and connectors; in the second phase the second switch is configured to uncouple the second of the first pair of contacts and connectors to a low potential supply node via the current source so that the first current passes through the first pair of contacts and connectors and the diode is configured to provide a shunt current path to shunt current from the inductance of the second of the first pair of contacts and connectors; in the third phase the second switch is configured to uncouple the second of the first pair of contacts and in combination with the diode provide a high impedance node.

The second switch may comprise an nMOS transistor controlled by an anode control signal.

The current driving circuitry may further comprise: a further switch configured to selectively couple the second of the second pair of contacts and connectors to a high potential supply node; and a further diode with a cathode coupled to the second of the second pair of contacts and connectors and an anode coupled to a low potential supply node; wherein: in the first phase the further switch is configured to couple the second of the second pair of contacts and connectors to a high potential supply node; in the second phase the further switch is configured to uncouple the second of the second pair of contacts and connectors from the high potential supply node such that the further diode is configured to provide a shunt current path to shunt current from the inductance of the second of the second pair of contacts and connectors; and in the third phase the further switch is configured to uncouple the second of the second pair of contacts and in combination with the further diode provide a high impedance node.

The further switch may comprise a pMOS transistor controlled by a cathode control signal.

The current driving circuitry may further comprise: a current source for providing the further current and selectively coupling the first of the second pair of contacts and connectors to a low potential supply node; and a second further switch configured to selectively couple the first of the second pair of contacts and connectors to a high potential supply node, wherein: in the first phase the current source is configured to couple the first of the second pair of contacts and connectors to a low potential supply node such that the further current passes through the second pair of contacts and connectors; in the second phase the current source is configured to couple the first of the second pair of contacts and connectors to a low potential supply node such that the further current passes through a first of the first pair of contacts and connectors, the laser diode and a first of the second pair of contacts and connectors; and in the third phase the second further switch configured to selectively couple the first of the second pair of contacts and connectors to a high potential supply node and provide a snub current path to snub current from the inductance of the first of the second pair of contacts and connectors.

The further switch may comprise a pMOS transistor controlled by a further cathode control signal.

The laser diode driver circuit may further comprise: timing generating circuitry configured to generate four phase shifted clock signals; combinational logic configured to receive the four phase shifted clock signals and generate phase defining signals for defining a start of the first phase, a start of the second phase and a start of the third phase, wherein the phase defining signals are based on one of: falling edges from the four phase shifted clock signals and falling edges from the four phase shifted clock signals; a level shifter for receiving the phase defining signals and output signals for controlling the current driving circuitry in order to operate in the first phase, the second phase and the third phase.

The timing generating circuitry may be configured to generate: a first clock signal; a second clock signal, which is a first phase-shifted version of the first clock signal and wherein; a third clock signal, which is a second phase-shifted version of the first clock signal and wherein subsequent falling or rising edges of the first clock signal and the third clock signal define the passing of the first current passing through the first pair of contacts and connectors and wherein subsequent falling or rising edges of the second clock signal and the third clock signal define the passing of the further current passing through the second pair of contacts and connectors; a fourth clock signal, which is a third phase-shifted version of the first clock signal, wherein a falling or rising edge of the third clock signal and the rising or falling edge of the fourth clock signal define the passing of the further current through the first of the first pair of contacts and connectors, the laser diode and the first of the second pair of contacts and connectors.

According to a second aspect there is provided a method comprising providing a laser diode driver circuit comprising: a first pair of contacts and connectors coupled to an anode of the laser diode, wherein an inductance of each of the first pair of contacts and connectors is the same; a second pair of contacts and connectors coupled to a cathode of the laser diode, wherein an inductance of each of the second pair of contacts and connectors is the same; current driving circuitry, wherein the method further comprises: operating the laser diode driver circuit in a first phase such that a first current passes through the first pair of contacts and connectors and a further current passes through the a second pair of contacts and connectors such that a potential difference between the cathode and anode is below a diode activation value;

operating the laser diode driver circuit in a second phase, succeeding the first phase, such that the further current passes through a first of the first pair of contacts and connectors, the laser diode and a first of the second pair of contacts and connectors such that the potential difference between the cathode and anode is above the diode activation value;

operating the laser diode driver circuit in a third phase, succeeding the second phase, such that a current passes through a first of the first pair of contacts and connectors, the laser diode and a first of the second pair of contacts and connectors and the potential difference between the cathode and anode is below the diode activation value.

The method may further comprise providing a first switch, the method further comprising using the first switch to selectively couple the first of the first pair of contacts and connectors to a high potential supply node wherein in the first, second and third phase the first switch is configured to couple the first of the first pair of contacts and connectors to a high potential supply node.

The first switch may comprise a pMOS transistor. The method may comprise controlling the pMOS transistor by a safety control signal.

The current driving circuitry may further comprise: a diode with an anode coupled to the second of the first pair of contacts and connectors and a cathode coupled to the high potential supply node; a current source for providing the first current; and a second switch configured to selectively couple the second of the first pair of contacts and connectors to a low potential supply node via the current source.

The method may further comprise coupling, using the second switch, in the first phase the second of the first pair of contacts and connectors to a low potential supply node via the current source so that the first current passes through the first pair of contacts and connectors.

The method may further comprise: uncoupling, using the second switch, in the second phase the second of the first pair of contacts and connectors to a low potential supply node via the current source so that the first current passes through the first pair of contacts and connectors and the diode is configured to provide a shunt current path to shunt current from the inductance of the second of the first pair of contacts and connectors. The method may further comprise: uncoupling, using the second switch, in the third phase the second of the first pair of contacts and in combination with the diode provide a high impedance node.

The second switch may comprise an nMOS transistor controlled by an anode control signal.

The current driving circuitry may further comprise: a further switch configured to selectively couple the second of the second pair of contacts and connectors to a high potential supply node; and a further diode with a cathode coupled to the second of the second pair of contacts and connectors and an anode coupled to a low potential supply node; wherein the method may comprise coupling using the further switch in the first phase the second of the second pair of contacts and connectors to a high potential supply node.

The method may further comprise uncoupling, using the further switch, in the second phase the second of the second pair of contacts and connectors from the high potential supply node such that the further diode is configured to provide a shunt current path to shunt current from the inductance of the second of the second pair of contacts and connectors.

The method may further comprise uncoupling, using the further switch, in the third phase the second of the second pair of contacts and in combination with the further diode provide a high impedance node.

The further switch may comprise a pMOS transistor controlled by a cathode control signal.

The current driving circuitry may further comprise: a current source for providing the further current and selectively coupling the first of the second pair of contacts and connectors to a low potential supply node; and a second further switch configured to selectively couple the first of the second pair of contacts and connectors to a high potential supply node, wherein the method may further comprise coupling using the current source the first of the second pair of contacts and connectors to a low potential supply node such that the further current passes through the second pair of contacts and connectors.

The method may further comprise coupling, using the current source, in the second phase the first of the second pair of contacts and connectors to a low potential supply node such that the further current passes through a first of the first pair of contacts and connectors, the laser diode and a first of the second pair of contacts and connectors.

The method may further comprise selectively coupling using the second further switch in the third phase the first of the second pair of contacts and connectors to a high potential supply node and provide a snub current path to snub current from the inductance of the first of the second pair of contacts and connectors.

The further switch may comprise a pMOS transistor controlled by a further cathode control signal.

The method may further comprise: generating four phase shifted clock signals; generating phase defining signals for defining a start of the first phase, a start of the second phase and a start of the third phase, wherein the phase defining signals are based on one of: falling edges from the four phase shifted clock signals and falling edges from the four phase shifted clock signals; generating output signals for controlling the current driving circuitry in order to operate in the first phase, the second phase and the third phase based on the phase defining signals.

The method may comprise generating: a first clock signal; a second clock signal, which is a first phase-shifted version of the first clock signal and wherein; a third clock signal, which is a second phase-shifted version of the first clock signal and wherein subsequent falling or rising edges of the first clock signal and the third clock signal define the passing of the first current passing through the first pair of contacts and connectors and wherein subsequent falling or rising edges of the second clock signal and the third clock signal define the passing of the further current passing through the second pair of contacts and connectors; a fourth clock signal, which is a third phase-shifted version of the first clock signal, wherein a falling or rising edge of the third clock signal and the rising or falling edge of the fourth clock signal define the passing of the further current through the first of the first pair of contacts and connectors, the laser diode and the first of the second pair of contacts and connectors.

According to a third aspect there is provided an apparatus comprising: laser diode driver means comprising: a first pair of contacts and connectors coupled to an anode of the laser diode, wherein an inductance of each of the first pair of contacts and connectors is the same; a second pair of contacts and connectors coupled to a cathode of the laser diode, wherein an inductance of each of the second pair of contacts and connectors is the same; current driving circuitry, wherein the current driver means is configured to operate such that: in a first phase a first current passes through the first pair of contacts and connectors and a further current passes through the a second pair of contacts and connectors such that a potential difference between the cathode and anode is below a diode activation value; in a second phase, succeeding the first phase, the further current passes through a first of the first pair of contacts and connectors, the laser diode and a first of the second pair of contacts and connectors such that the potential difference between the cathode and anode is above the diode activation value; in a third phase, succeeding the second phase, a current passes through a first of the first pair of contacts and connectors, the laser diode and a first of the second pair of contacts and connectors and the potential difference between the cathode and anode is below the diode activation value.

The current driver means may comprise: a first switch means configured to selectively couple the first of the first pair of contacts and connectors to a high potential supply node wherein in the first, second and third phase the first switch means is configured to couple the first of the first pair of contacts and connectors to a high potential supply node.

The first switch means may comprise a pMOS transistor controlled by a safety control signal.

The current driver means may further comprise: a diode with an anode coupled to the second of the first pair of contacts and connectors and a cathode coupled to the high potential supply node; a current source for providing the first current; and a second switch means configured to selectively couple the second of the first pair of contacts and connectors to a low potential supply node via the current source, wherein: in the first phase the second switch means is configured to couple the second of the first pair of contacts and connectors to a low potential supply node via the current source so that the first current passes through the first pair of contacts and connectors; in the second phase the second switch means is configured to uncouple the second of the first pair of contacts and connectors to a low potential supply node via the current source so that the first current passes through the first pair of contacts and connectors and the diode is configured to provide a shunt current path to shunt current from the inductance of the second of the first pair of contacts and connectors; in the third phase the second switch means is configured to uncouple the second of the first pair of contacts and in combination with the diode provide a high impedance node.

The second switch means may comprise an nMOS transistor controlled by an anode control signal.

The current driver means may further comprise: a further switch means configured to selectively couple the second of the second pair of contacts and connectors to a high potential supply node; and a further diode with a cathode coupled to the second of the second pair of contacts and connectors and an anode coupled to a low potential supply node; wherein: in the first phase the further switch means is configured to couple the second of the second pair of contacts and connectors to a high potential supply node; in the second phase the further switch means is configured to uncouple the second of the second pair of contacts and connectors from the high potential supply node such that the further diode is configured to provide a shunt current path to shunt current from the inductance of the second of the second pair of contacts and connectors; and in the third phase the further switch means is configured to uncouple the second of the second pair of contacts and in combination with the further diode provide a high impedance node.

The further switch means may comprise a pMOS transistor controlled by a cathode control signal.

The current driver means may further comprise: a current source for providing the further current and selectively coupling the first of the second pair of contacts and connectors to a low potential supply node; and a second further switch means configured to selectively couple the first of the second pair of contacts and connectors to a high potential supply node, wherein: in the first phase the current source is configured to couple the first of the second pair of contacts and connectors to a low potential supply node such that the further current passes through the second pair of contacts and connectors; in the second phase the current source is configured to couple the first of the second pair of contacts and connectors to a low potential supply node such that the further current passes through a first of the first pair of contacts and connectors, the laser diode and a first of the second pair of contacts and connectors; and in the third phase the second further switch means may be configured to selectively couple the first of the second pair of contacts and connectors to a high potential supply node and provide a snub current path to snub current from the inductance of the first of the second pair of contacts and connectors.

The further switch means may comprise a pMOS transistor controlled by a further cathode control signal.

The current driver means may further comprise: means for generating timing signals configured to generate four phase shifted clock signals; means for combining timing signals configured to receive the four phase shifted clock signals and generate phase defining signals for defining a start of the first phase, a start of the second phase and a start of the third phase, wherein the phase defining signals are based on one of: falling edges from the four phase shifted clock signals and falling edges from the four phase shifted clock signals; means for level shifting configured to receive the phase defining signals and output signals for controlling the current driving circuitry in order to operate in the first phase, the second phase and the third phase.

The means for generating timing signals may be configured to generate: a first clock signal; a second clock signal, which is a first phase-shifted version of the first clock signal and wherein; a third clock signal, which is a second phase-shifted version of the first clock signal and wherein subsequent falling or rising edges of the first clock signal and the third clock signal define the passing of the first current passing through the first pair of contacts and connectors and wherein subsequent falling or rising edges of the second clock signal and the third clock signal define the passing of the further current passing through the second pair of contacts and connectors; a fourth clock signal, which is a third phase-shifted version of the first clock signal, wherein a falling or rising edge of the third clock signal and the rising or falling edge of the fourth clock signal define the passing of the further current through the first of the first pair of contacts and connectors, the laser diode and the first of the second pair of contacts and connectors.

BRIEF DESCRIPTION OF THE SEVERAL VIEWS OF THE DRAWINGS

Some embodiments will now be described by way of example only and with reference to the accompanying Figures in which.

DETAILED DESCRIPTION

The technique as embodied herein is shown by apparatus and methods for controlling laser diode driver currents.

As discussed herein, for Time-of-Flight (TOF) range or distance determination applications a modulated optical signal is employed as a transmission signal for ranging.

A pulse train offers the advantage of a higher modulation contrast versus a sinusoid and can produce better signal to noise ratios. Furthermore a pulse signal with less than 50% duty cycle presents suitable power efficiency advantages versus a sinusoid. For example a Root Mean Squared (RMS) current ($I_{DC}=I_{peak}/\text{sqrt}(2)$) of a sinusoid versus a Pulse Width Modulated (PWM) current operating at 50% duty cycle ($I_{DC}=I_{peak}*0.5$)

The modulation frequency of the TOF transmission signal also affects the ranging accuracy, expressed as a standard deviation (i.e., ranging distance error) from the ideal distance. This standard deviation is known in the art to relate inversely proportional to the modulation frequency. In other words an increasing frequency transmission signal reduces the ranging error. It is hence beneficial to increase the operation frequency of the transmit signal.

In Direct TOF (DTOF) implementations, a receiver can be configured to generate a Time Correlated Single Photon Counting (TCSPC) histogram which is builds up an image of a return pulse, in other words the time of flight of light, integrating the photon counts over time.

In a pulse train transmission signal system, it is beneficial to maintain a pulse width of low duty cycle, to be able to resolve multiple targets (in other words to be able to receive return pulses from both near and far targets without the return pulses overlapping) within region of interest (ROI). This as well produces the power efficiency gain highlighted above. In an idealized scenario, the transmission pulse would resemble an impulse.

The generation of the optical transmission pulse train may be performed by an electrical current pulse train directly modulating a VCSEL (or suitable solid-state LASER). The electrical current pulse is designed or selected such that it has a high peak-to-trough modulation contrast ratio, a minimum pulse width for maximizing power efficiency, and a high frequency of modulation for increasing the resolution of ranging and hence reducing the standard deviation of error.

It is known that the voltage across an inductor equals the value of its inductance multiplied by the step change in current through the inductor ($V_L=L \cdot di/dt$). It can be observed that any inductance in series to the driven path of a TOF system described above would impede its operation with respect to attempting to achieve the best performance as the inductance would potentially limit peak-to-trough modulation contrast ratio, minimum pulse width, and highest frequency of modulation.

Figure 1A:
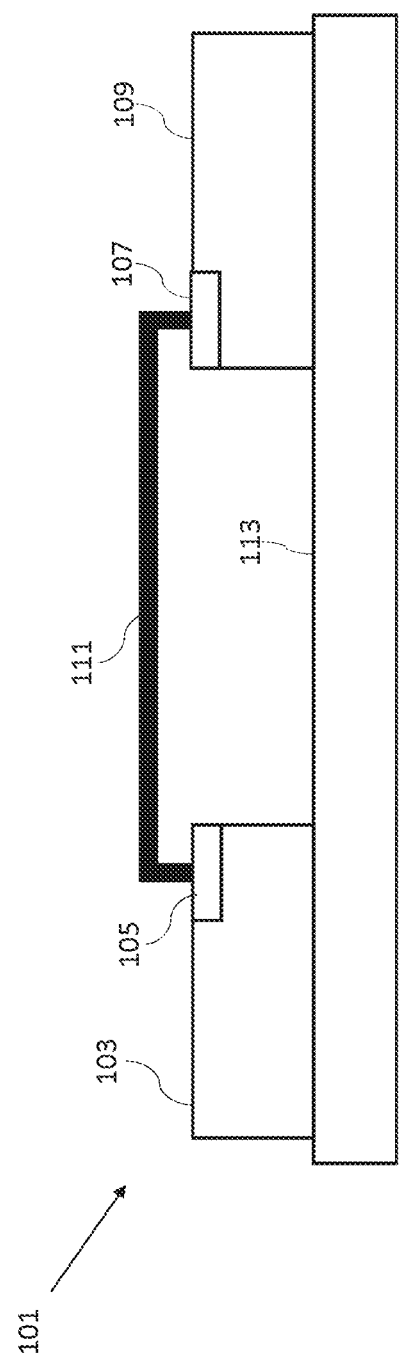
FIG. 1a shows a schematic view of laser driver and laser mounted on an example sub-mount.

As mentioned previously the sensor/controller module and laser module (or dies) may be connected using wire-bonding. An example of which is shown in FIG. 1a which shows the sub-mount 113 on which there is mounted a sensor/laser diode driver module 103 and a laser diode module 109. The sensor/laser diode driver module 103 is connected a contact pad 105. The contact pad 105 is connected to a further contact pad 107 by a wire-bonding 111. The further contact pad 107 is connected to the laser diode module 109. Furthermore electrical routing may also traverse via a wire-bonding to an electrical trace on the sub-mount, where the inductive contribution from both is summed to form the effective inductance.

The approximate inductance of a 25.4 µm (1 mil) diameter gold wire-bonding is 1 nH per millimeter. This parasitic inductance cannot be eliminated.

Figure 1B:
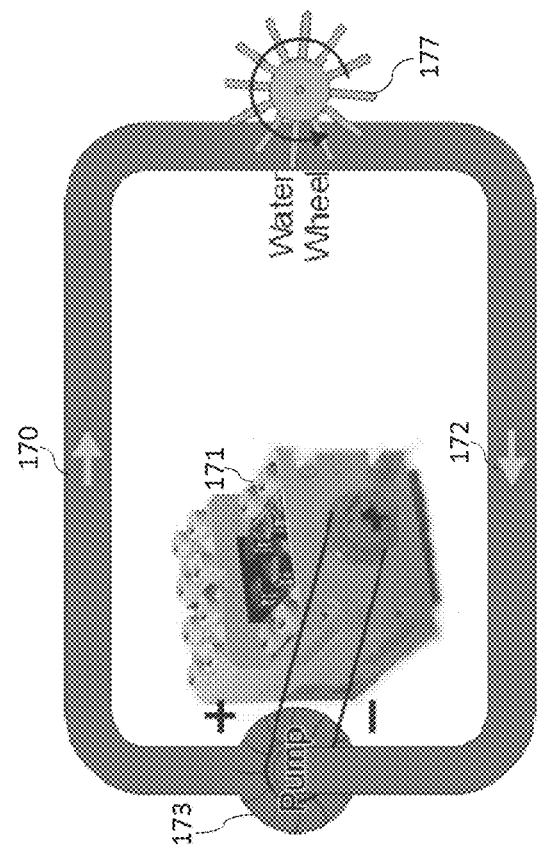
FIG. 1b shows an analogous view of the effect of the inductance generated by the contact pads and bonding wires.
Figure 1B:
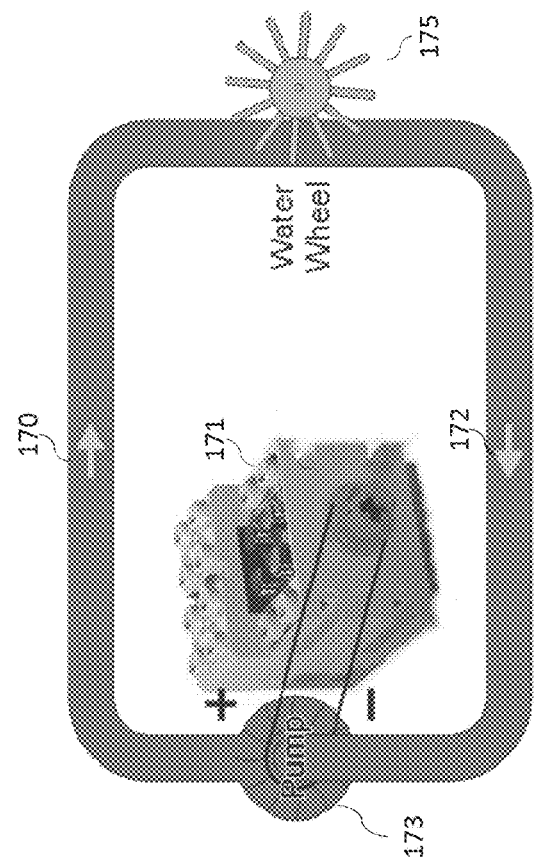

As discussed above this parasitic inductance has the effect of limiting substantially instantaneous switching of current. This can be seen as shown in the FIG. 1b based on an inductor analogy example from https://ece.uwaterloo.ca/~dwharder/Analogy/Inductors/ to be analogous to the effect of a water wheel impeding the immediate change of flow of water in a system. For example as shown in on the left hand side of FIG. 1b a motor 171 which is connected to a pump 173 attempts to change the flow of water (shown by arrow 172) in a system 170. However the system furthermore comprises a water wheel 175 which is analogous to the inductor such as the 'connection' or parasitic inductor. When the motor 171 attempts to generate a pulse and pump water through the system (the laser diode current driver attempting to generate an electrical pulse) the waterwheel 175, which is initially static, slows the change of the flow until the wheel is turning at the speed of the pump 173 (in a manner similar that the current driven by the current driver is impeded until the inductor current is the same as the driver current).

The technique as discussed in further detail by the embodiments hereafter is for a laser diode (LD) driver design which is able to utilize this 'connection' inductance and by utilizing the inductance to enable a good contrast ratio, power efficiency, and resolution and reduced ranging error. This is shown analogously on the right hand side of FIG. 1b where the motor 171 which is connected to a pump 173 and which attempts to change the flow of water (shown by arrow 172) in a system 170. In this example the system furthermore comprises a water wheel 177 which is analogous to the 'connection' or parasitic inductor. In this example the water wheel 177 is already spinning at the desired flow rate before the motor 171 attempts to generate a pulse and pump water through the system (the laser diode current driver attempting to generate an electrical pulse) and thus the waterwheel 177, does not slow the change of the flow. In other words in the embodiments as described hereafter the inductor is configured such that it is 'precharged' with a current that is the same as the current driven by the current driver before the current pulse is provided to the laser diode.

Figure 1C:
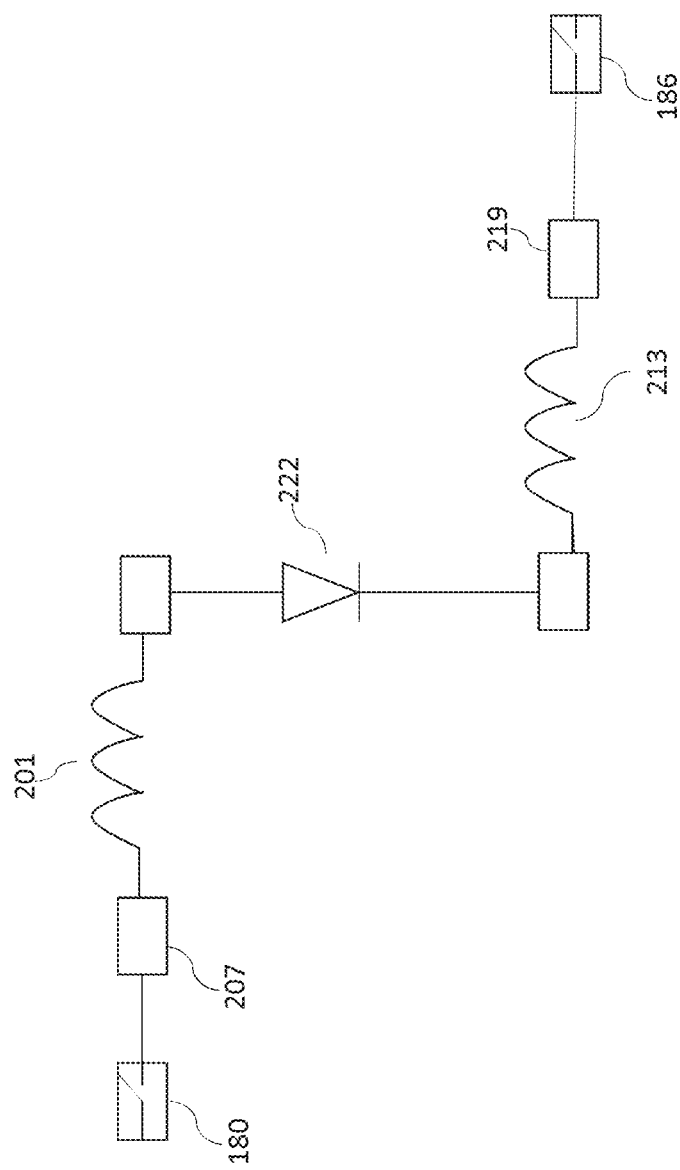
FIG. 1c shows a schematic view of conventional laser driver and laser diode circuit.

An example conventional laser diode and driver configuration is shown in the circuit diagram shown in FIG. 1c.

FIG. 1c shows the diode 222 which is coupled at an anode node via a first wire-bonding 201 (which operates as a first inductor) and a pad 207 to a first switching element 180 suitable for switching on a positive (or high) supply voltage. Furthermore the diode 222 is coupled at a cathode node via a second wire bonding 213 (which operates as a second inductor) and a second pad to a second switching element 186 which may switch to a negative (or low) supply voltage and via a current source.

Figure 1D:
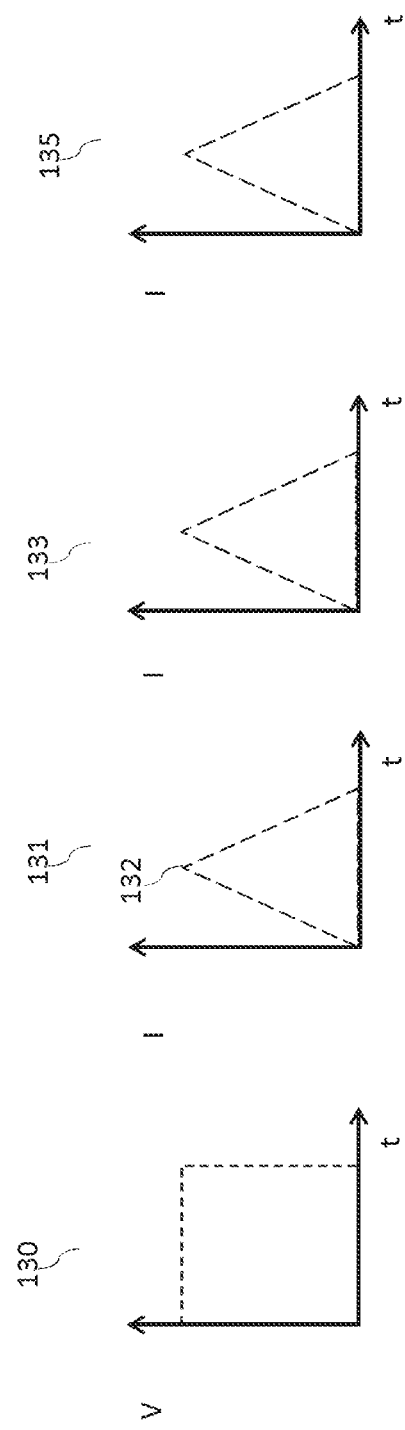
FIG. 1d shows graphs of the voltages and currents in the circuit shown in FIG. 1c.

The effect of the inductors can be shown by the graphs shown in FIG. 1d. The first graph 130 indicates the voltage across the pads formed by switching on the first switching element 180 and second switching element 186 to generate a control pulse.

The second graph 131 shows the current through the first wire bonding 201, the second graph 133 shows the current through the second wire bonding 213 and the third graph 135 shows the current through the laser diode 222. All three show the same effect of the inductors slowing the rate of change of the current such that the peak current shown at time 132 occurs significantly after the switching on of the control pulse.

Figure 1E:
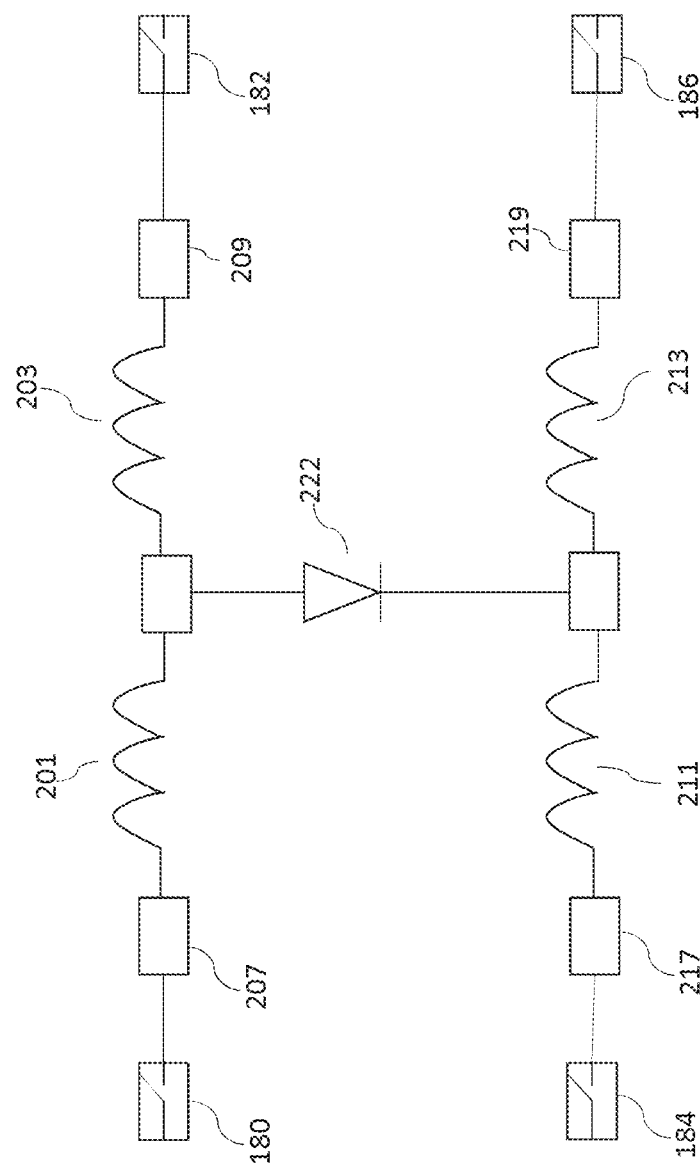
FIG. 1e shows a schematic view of a circuit suitable for implementing some embodiments.

With respect to FIG. 1e is shown an overview summary of a schematic view of some embodiments. In this example the diode 222 is coupled at an anode node via a first anode wire-bonding 201 (which operates as a first inductor) and a pad 207 to a first anode switching element 180 suitable for switching on a positive (or high) supply voltage.

The diode 222 is furthermore coupled at an anode node via a second anode wire-bonding 203 (which operates as a second inductor) and a pad 209 to a second anode switching element 182.

In the following embodiments the first inductor and the second inductor are matched. This for example may be achieved by the wire-bondings being the same for the first anode wire-bonding 201 and the second anode wire-bonding 203.

Furthermore the diode 222 is coupled at a cathode node via a first cathode wire bonding 211 (which operates as a third inductor) and a pad 217 to a first cathode switching element 184.

Also the diode 222 is coupled at a cathode node via a second cathode wire bonding 213 (which operates as a fourth inductor) and a pad 219 to a second cathode switching element 186 which may for example switch to a negative (or low) supply voltage and via a current source.

In the following embodiments the third inductor and the fourth inductor are matched. This for example may be achieved by the wire-bondings being the same for the first cathode wire-bonding 211 and the second cathode wire-bonding 213.

Thus although in the embodiments shown herein wire bonding or inductance 201=203, and wire bonding or inductance 211=213 it is not necessary for a sum of inductance 201+203 to equal 211+213.

The signaling path (both forward and return) in the embodiments as described herein may be implemented as two pairs of wires, with a switching sequence broken down into three distinct stages.

Figure 2:
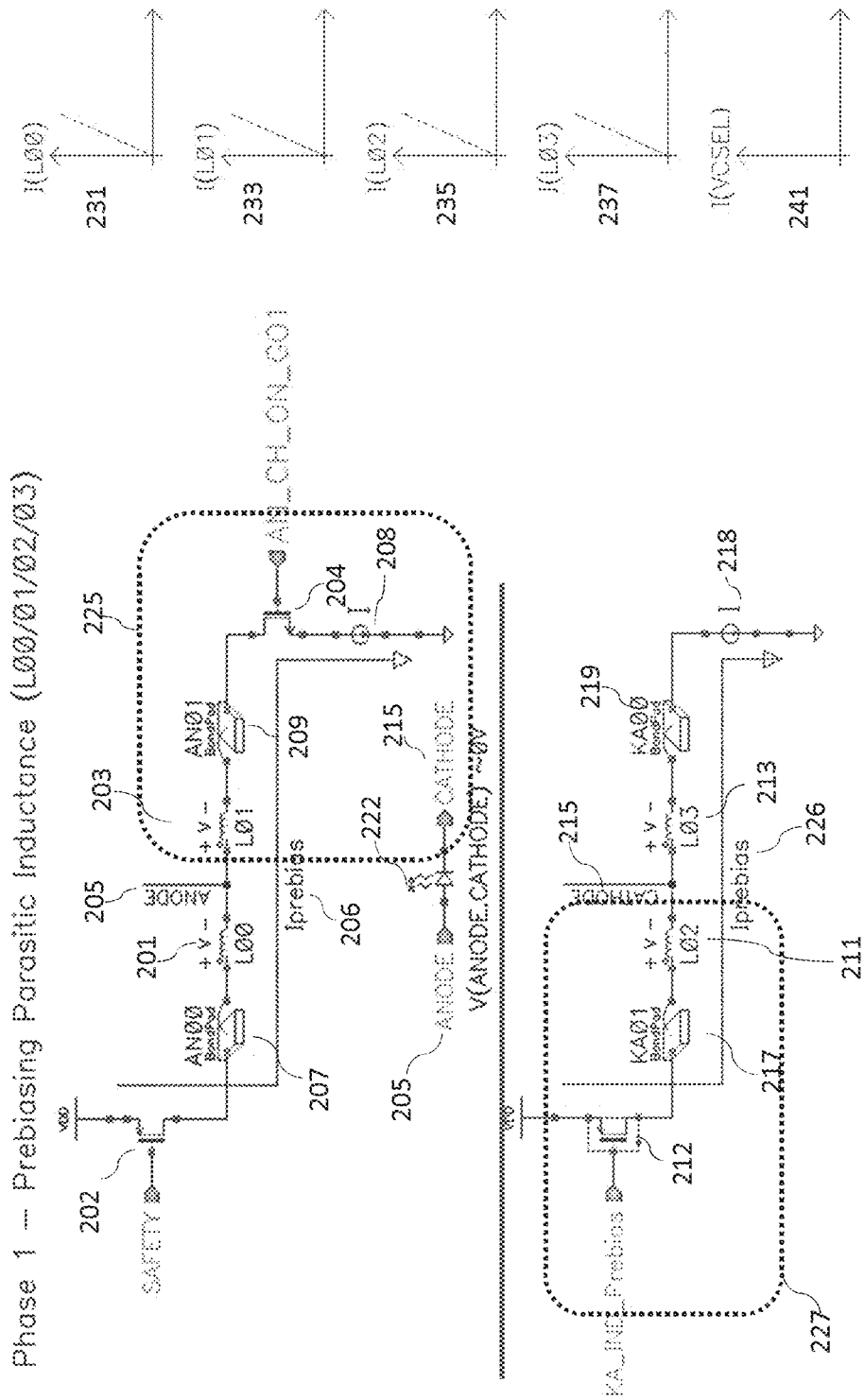
FIG. 2 shows a schematic view of a circuit suitable for implementing a first phase of the inductance compensation operation according to some embodiments.
Figure 3:
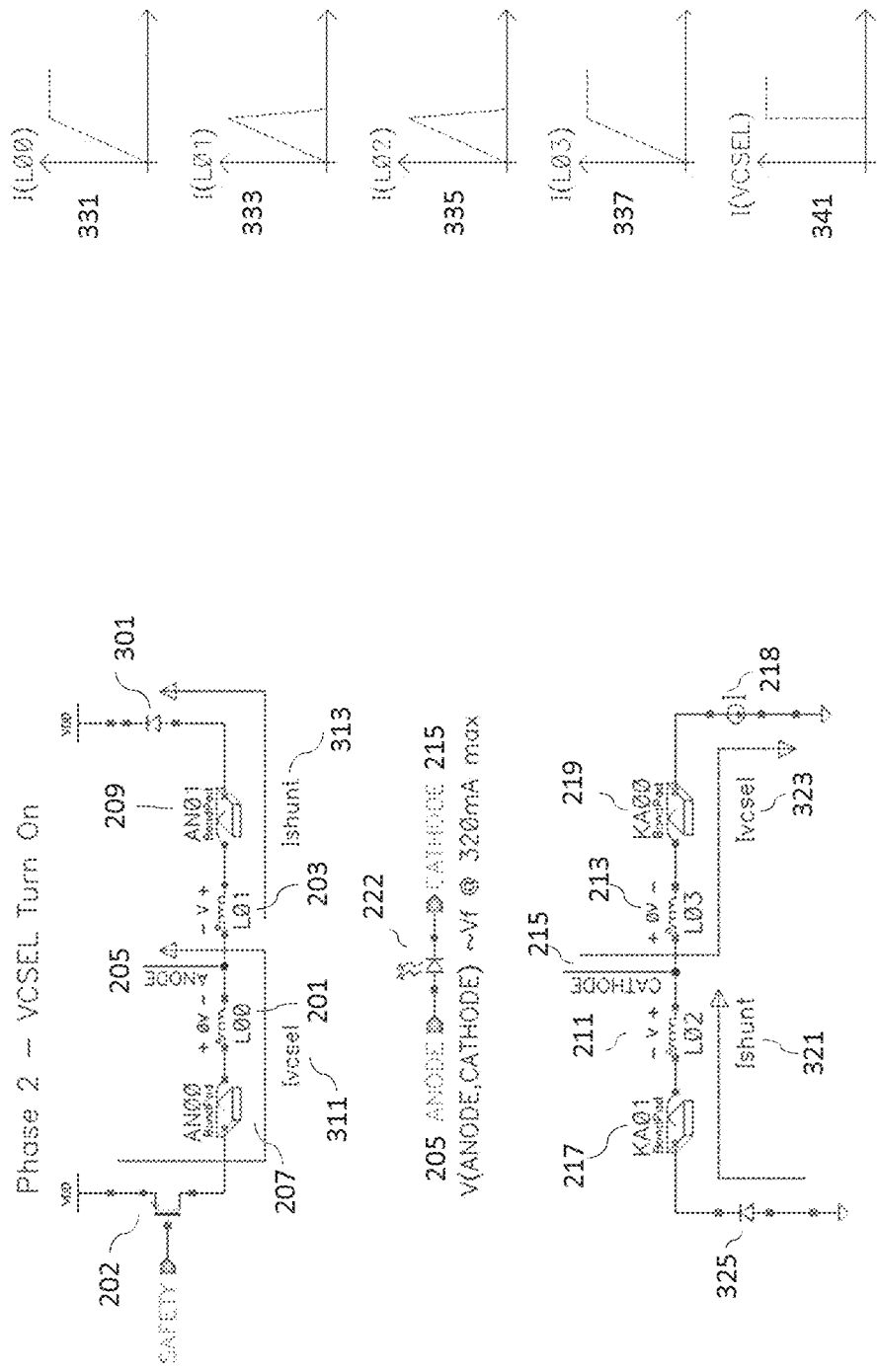
FIG. 3 shows a schematic view of a circuit suitable for implementing a second phase of the inductance compensation operation according to some embodiments.
Figure 4:
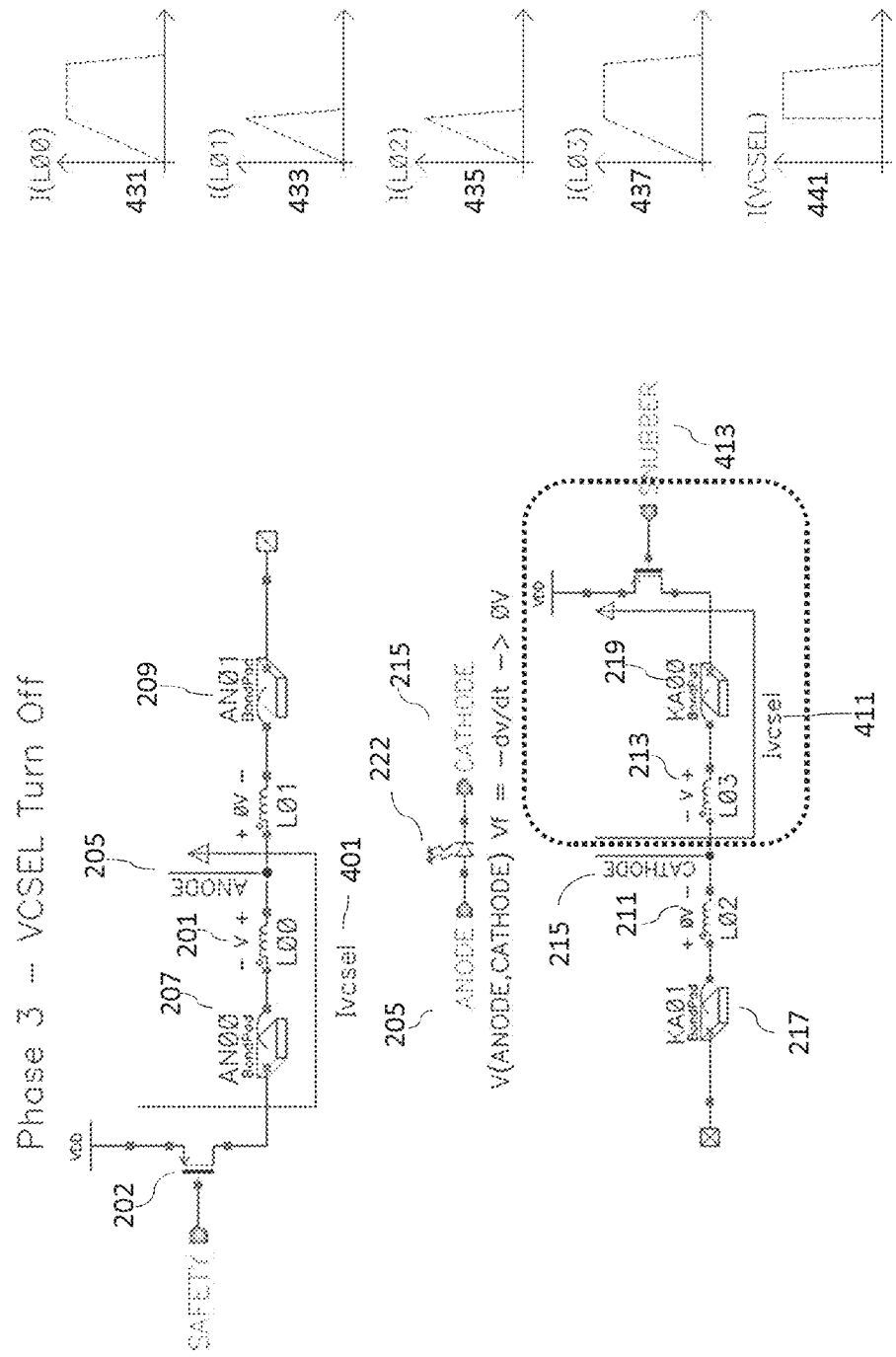
FIG. 4 shows a schematic view of a circuit suitable for implementing a third phase of the inductance compensation operation according to some embodiments.

The three distinct stages are shown in FIGS. 2 to 4.

FIG. 2 shows schematically the first phase, a pre-biasing inductance phase. In this example the first anode switching element is shown comprising a pMOS transistor 202 configured to couple the pad 207 to a positive (or high) supply voltage $V_{dd}$. The pMOS transistor 202 may be controlled by a safety signal.

The second anode switching element is shown comprising a nMOS transistor 204 configured to couple the pad 209 to a current source 208 which in turn is coupled to a negative (or low) supply voltage.

The first cathode switching element is shown comprising an nMOS transistor 212 configured to couple the pad 217 to a positive (or high) supply voltage $V_{dd}$. The nMOS transistor 212 may also be controlled by the safety signal.

The second cathode switching element is shown coupling the pad 219 to a further current source 218 which in turn is coupled to a negative (or low) supply voltage.

In such a manner due to the symmetry in the anode and cathode supplies there is no potential difference across the diode, in other words the voltage at the node 205 is the same as the voltage at the node 215.

Furthermore a first pre-bias current $I_{prebias}$ starting from 0 to a value $I_{vcsel}$ flows from the positive (or high) supply voltage $V_{dd}$ via the anode to the negative supply voltage and a second pre-bias current $I_{prebias}$ starting from 0 to a value $I_{vcsel}$ flows from the positive (or high) supply voltage $V_{dd}$ via the cathode to the negative supply voltage.

These currents are shown in FIG. 2 by a graph 231 of current against time for the first inductor 201 showing the current rising linearly from 0 to $I_{vcsel}$ based on the inductance of the inductor L00, a graph 233 of current against time for the second inductor 203 showing the current rising linearly from 0 to $I_{vcsel}$ based on the inductance of the inductor L01, a graph 235 of current against time for the third inductor 211 showing the current rising linearly from 0 to $I_{vcsel}$ based on the inductance of the inductor L02, and a graph 237 of current against time for the fourth inductor 213 showing the current rising linearly from 0 to $I_{vcsel}$ based on the inductance of the inductor L03. Furthermore is shown the lack of current though the laser diode in the graph 241.

In other words in the first phase, inductance pre-biasing current sources, set at the same magnitude as the peak lasing current, present a direct current loop back. The pair of anode pads 207 AN00 and 209 AN01 form an anode loop back path 206, where the pad 207 AN00 conveys the forward current path and pad 209 AN01 receives the return current path. Similarly pads 219 KA00 (return path) and 217 KA01 (forward path), form a cathode loop back path.

As described above the path inductances (e.g., inductors 201 L00 and 203 L01) forming a loop back current 216 are configured to be substantially identical (i.e., inductance L00+L01=L00*2=L01*2). Similarly the same limitation applies to the cathode loop back path inductors. However it is understood that the inductors 201 and 203 may not be equal to inductors 211 and 213.

In some embodiments where L00+L01 is not equal L02+L03 (or with tolerance mismatch), a non-lasing condition can still be met where the voltage across the laser diode (VCSEL) is less than its turn on voltage.

FIG. 3 shows schematically the second phase, a laser diode turn on phase. In this example the first anode switching element is shown comprising the pMOS transistor 202 configured to couple the pad 207 to the positive (or high) supply voltage $V_{dd}$ The pMOS transistor 202 may be controlled by the safety signal.

The second anode switching element is shown being configured to couple the pad 209 via a diode 301 to a positive (or high) supply voltage.

The first cathode switching element is shown configured to couple the pad 217 via a diode 325 to a negative (or low) supply voltage.

The second cathode switching element is shown coupling the pad 219 to the further current source 218 which in turn is coupled to a negative (or low) supply voltage.

In such a manner the pre-charged currents are such that for the second phase the diode current $I_{vcsel}$ 311, 323 can pass via inductor 201 and through the diode 333 and inductor 213. Also the pre-charged currents for the inductor 321 and inductor 203 can be shunted via the diodes 325 and 301 respectively.

Thus in the second phase, as the current through inductor 201 L00 (and thus inductor L01 203) and inductor 211 L02 (and thus inductor 213 L03) reach the same magnitude as the peak lasing current, the pre-biasing current source terminates, whilst the residual pre-bias current that had built up in inductors 203 L01 and 211 L02 decays through their respective shunting paths.

The current flowing through inductor 201 L00 and 203 L03 thus enters steady-state (i.e., di/dt=0) and the voltage across L00 and L03 is zero volt (i.e., a voltage short) when the turn-on phase is started thus in effect cancelling out the inductance that was present in series to the pulsed current.

These currents are shown in FIG. 3 by a graph 331 of current against time for the first inductor 201 showing the current having risen linearly from 0 to $I_{prebias}$ being in the steady-state region, a graph 333 of current against time for the second inductor 203 showing the current having risen linearly from 0 to $I_{prebias}$ then being shunted back to zero in the second phase, a graph 335 of current against time for the third inductor 211 showing the current having risen linearly from 0 to $I_{prebias}$ then being shunted back to zero in the second phase, and a graph 337 of current against time for the fourth inductor 213 showing the current having risen linearly from 0 to $I_{prebias}$ and being in the steady-state region in the second phase. Furthermore is shown in the graph 341 the current pulse through the laser diode in the second phase.

Thus, it is demonstrated, in using this scheme, the turn on di/dt is improved upon the prior art.

FIG. 4 shows schematically the third phase, a laser diode turn off phase. In this example the first anode switching element is shown comprising the pMOS transistor 202 configured to couple the pad 207 to the positive (or high) supply voltage $V_{dd}$. The pMOS transistor 202 may be controlled by the safety signal.

The second anode switching element is shown being configured to couple the pad 209 to a floating node (i.e., operating as a high impedance node).

The first cathode switching element is shown configured to couple the pad 217 to a floating node (i.e., operating as a high impedance node).

The second cathode switching element is shown comprising a (snubber) pMOS transistor 413 configured to couple the pad 219 to the positive (or high) supply voltage $V_{dd}$. The (snubber) pMOS transistor 413 may be controlled by a snubber signal.

The snubber transistor allows a shunting of the current $I_{vcsel}$. The turn off termination of the pulsed current, with the clamping path via the snubber switch can be applied dissipating the residual current shown as current 401 and 411 within inductors 201 L00 and 213 L03 and clamps the laser diode (VCSEL) anode and cathode as a short circuit.

In such a manner it can be seen that the turn off di/dt would be limited by the combined inductance of inductors 201 L00 and 213 L03.

These currents are shown in FIG. 4 by a graph 431 of current against time for the first inductor 201 showing the current having risen linearly from 0 to $I_{prebias}$ then being in the steady-state region and then in the third phase dissipating quickly. The graph 433 of current against time for the second inductor 203 showing the current having risen linearly from 0 to $I_{prebias}$ in the first phase then being shunted back to zero in the second phase and remaining zero in the third phase. The graph 435 of current against time for the third inductor 211 showing the current having risen linearly from 0 to $I_{prebias}$ in the first phase, then being shunted back to zero in the second phase and remaining zero in the third phase. The graph 437 of current against time for the fourth inductor 213 showing the current having risen linearly from 0 to $I_{prebias}$ in the first phase, being in the steady-state region in the second phase and then dissipating in the third phase. Furthermore is shown in the graph 441 the current pulse dissipating through the laser diode in the third phase.

The timing between the first phase and second phase sets up an inductance pre-biasing current. This current di/dt is relative to the inductance value (in other words of the signal path), required peak pulsed current and available driving DC supply voltage source (in other words across the high supply voltage VDD and low supply voltage GND).

For example for a total path inductance of 2 nH, with a voltage source of 3.6V, and peak pulsed current 320 mA, the time duration at which a pre-biasing is applied is 177.8 ps (V=L·di/dt, V=3.6, L=2e-9, di=320e-3).

For a pulse width, the transmission bandwidth (BW) for a pulse signal of minimum pulse width (PW) equal to the pulse rise time, (Tr)+fall time (Tf), is approximated as BW=1/(Tr+Tf), or 1/PW. This is an interpretation from the Fourier transform of a rectangular function in a time domain to a sinc function in a frequency domain.

In some embodiments the generation of timing pulses can be designed for the generation of inductance pre-biasing current. In these embodiments a timing generator is utilized to encode this timing information using a series of phase differences between four digital signals of 50% duty cycle.

This set of digital signals in some embodiments can have an equal repetition rate (but different phases) equal to that of the pulsing frequency of the system operation.

Figure 5:
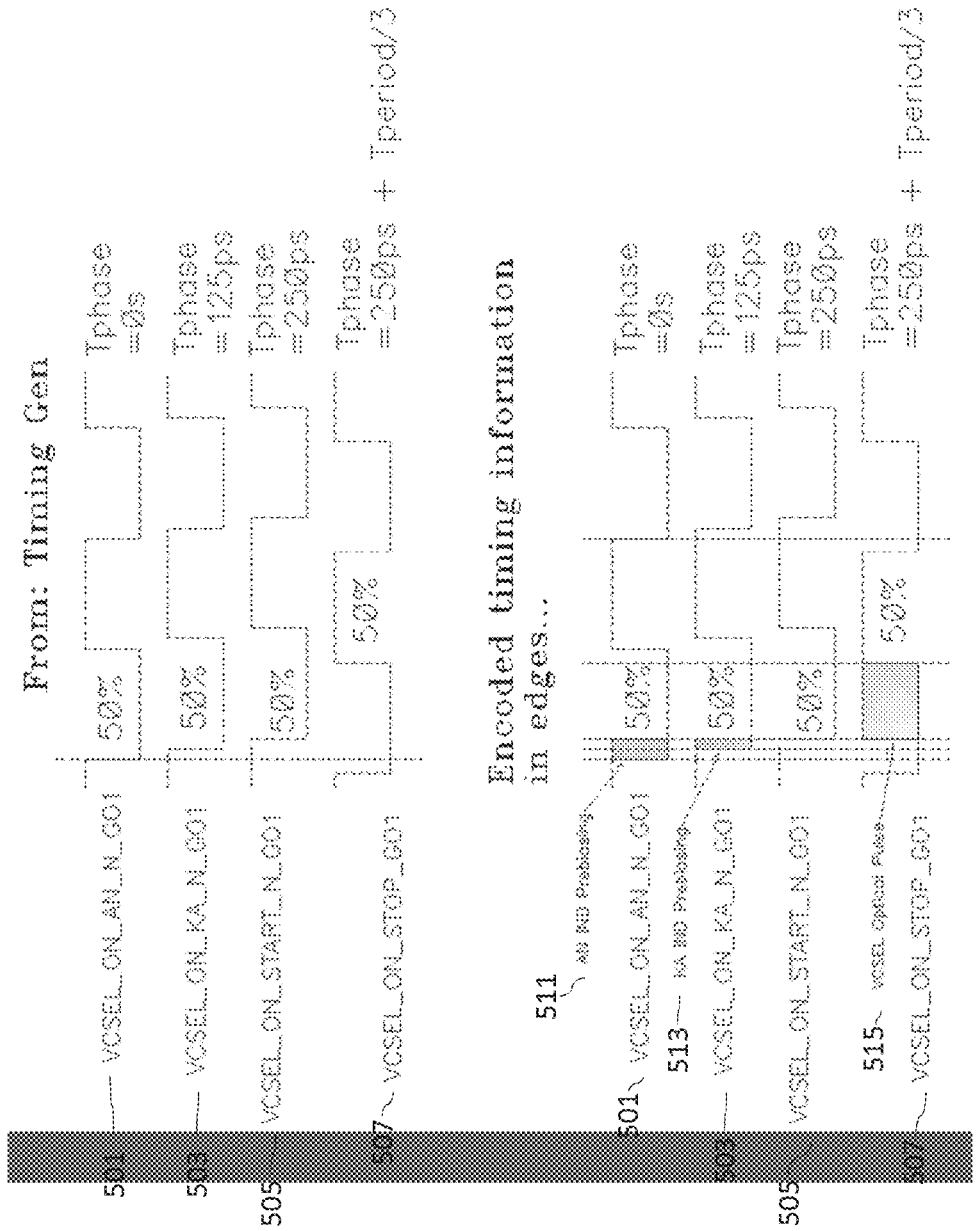
FIG. 5 shows an example timing signal diagram for controlling the first, second and third phases according to some embodiments.

For example FIG. 5 shows example timing generation signals.

The first signal is a 50% duty cycle square wave with Tphase=0 defined as VCSEL_ON_AN_N_GO1 signal 501.

The second signal is a further 50% duty cycle square wave but with a Tphase=125 ps defined as VCSEL_ON_K-A_N_GO1 signal 503.

The third signal is also a 50% duty cycle square wave but with a Tphase=250 ps defined as VCSEL_ON_START_N_GO1 signal 505.

A fourth signal is also a 50% duty cycle square wave but with a Tphase=250 ps+Tperiod/3 defined as VCSEL_ON_STOP_GO1 signal 507.

The signals defined with a 'N' (VCSEL_ON_AN_N_GO1 signal 501, VCSEL_ON_KA_N_GO1 signal 503 and VCSEL_ON_START_N_GO1 signal 505) have phase or timing information encoded on a falling or negative edge and the signals without (VCSEL_ON_STOP_GO1 signal 507) encoded on a rising or positive edge.

Thus as shown on the lower part timing diagram of FIG. 5, the encoded pulse information is shown by the shaded area.

Thus the time and duration of the anode inductance prebiasing (defined as AN IND prebiasing region 511) is shown in FIG. 5 by the difference between the falling edges of the first (VCSEL_ON_AN_N_GO1) signal 501 and the third (VCSEL_ON_START_N_GO1) signal 505.

The time and duration of the cathode inductance prebiasing (defined as KA IND prebiasing region 513) is shown in FIG. 5 by the difference between the falling edges of the second (VCSEL_ON_KA_N_GO1) signal 503 and the third (VCSEL_ON_START_N_GO1) signal 505.

Also the time and duration of the laser diode on period (defined as VCSEL optical pulse region 515) is shown in FIG. 5 by the difference between the falling edge of the third (VCSEL_ON_START_N_GO1) signal 505 and the rising edge of the fourth (VCSEL_ON_STOP_GO1) signal 507.

Figure 6:
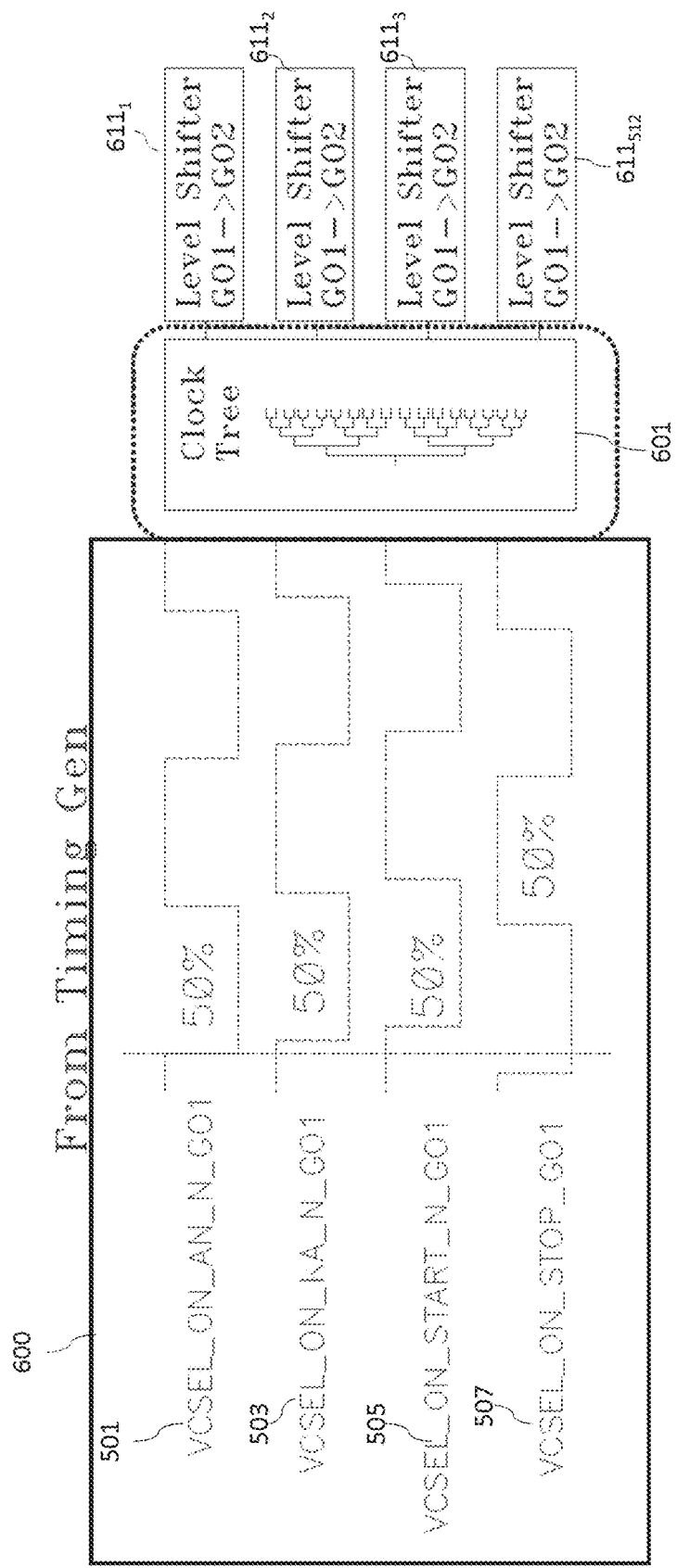
FIG. 6 shows a schematic timing circuit for generating the timing signals as shown in FIG. 5 and for controlling the first, second and third phases according to some embodiments.

The timing signal distribution apparatus in some embodiments may be shown in FIG. 6. The timing generator 600 configured to generate the first to fourth timing signals 501, 503, 505, and 507 are then configured to pass these to a clock tree 601 which then output the signals to level shifters 611 for each channel (in the example shown in FIG. 5 there are shown a first channel level shifter $611_1$, a second channel level shifter $611_2$, a third channel level shifter $611_3$, and a 512th channel level shifter $611_{512}$.

To maintain fidelity of phase information over large spatial layout on a die, for example an implementation of an integrated driver with multiple output channels the apparatus uses pairs of pad, for forward and return paths, double the spatial need required with the extra pads (i.e., the contrast between the example shown in FIG. 1c versus the example shown in FIG. 1e), and the encoded phase information can be distributed via high BW, small geometry CMOS logic (using process GO1, e.g., 40 nm logic), using the clock tree, to equalize the transmission delay (i.e., intrinsic delay of the repeater logic and interconnect RC, which may be represented using Elmore delay model).

In some embodiments is possible to remove any restrictions of how or where the source of this phase information is controlled, programmed, derived, thus encoded, where it can be digitally synthesized with Register Transfer Level (RTL) design abstraction and placed in proximity to the Phase Lock Loop (PLL) synthesizing the system operating frequencies and/or generating the required relative phase resolution.

Furthermore in some embodiments by using small geometry logic at this stage also significantly reduces the dynamic power consumption, as represented by $P=C.f.V^2$, for C=total switching CMOS gate capacitance, f=switching frequency, V=supply voltage of logic.

Figure 7:
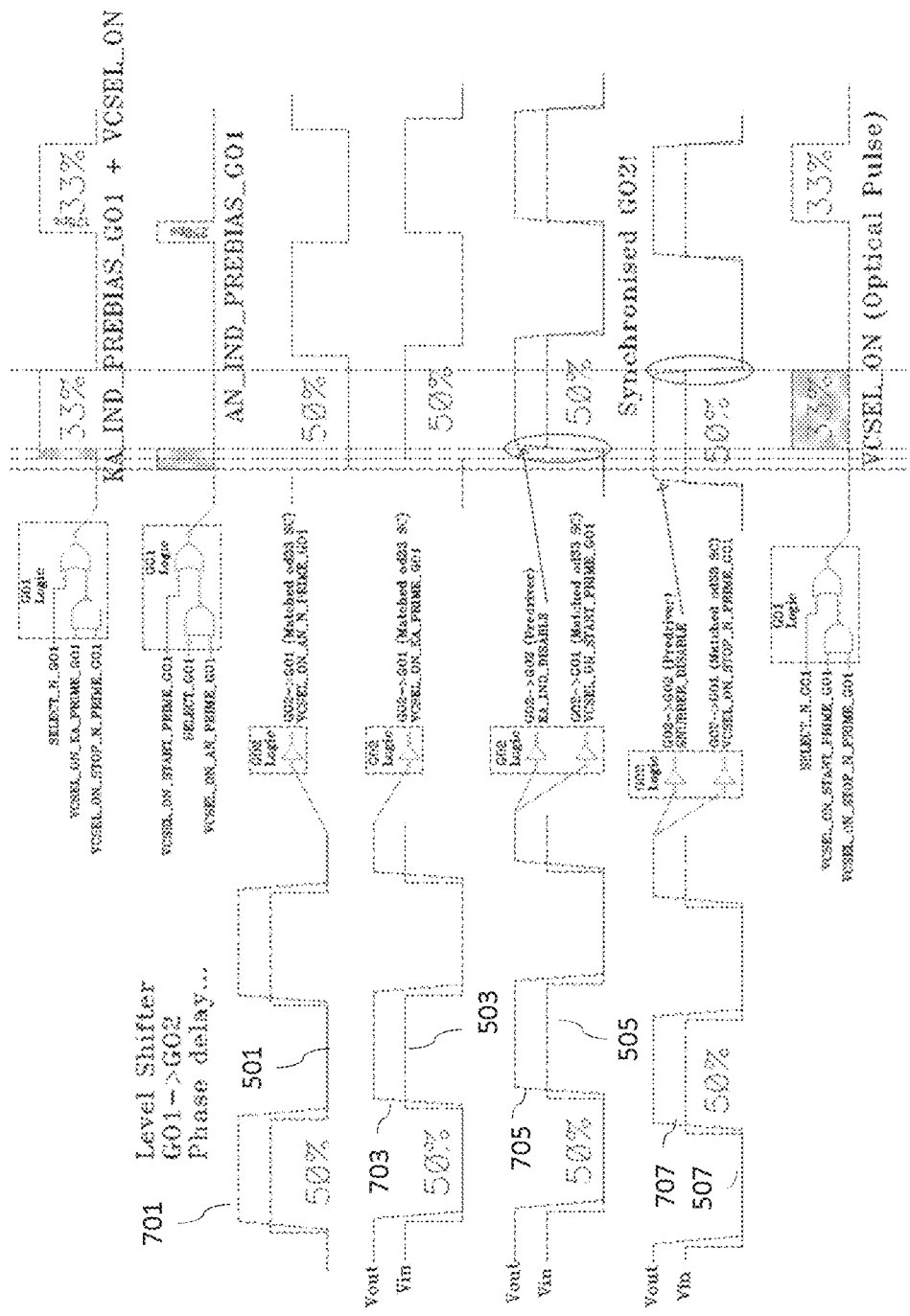
FIG. 7 shows a schematic view of timing signals and the level shifted timing signals according to some embodiments.

The level shifter converts the clock tree GO1 logic level to the output driving GO2 level. In other words to bias (or pulse) a VCSEL in excess of its forward biasing turn on voltage (Vf, e.g., for 940 nm GaAs diode is approximately 1.4~1.5V at room temperature), it requires higher voltage tolerant devices (GO2), in which case, at the terminating branch of the clock tree signals (i.e., logic level), high speed voltage level shifting is performed to interface GO2 devices. With the BW limitation of GO2 devices, these level-shifters are placed within close proximity to the driving output stages, and specifically designed to ensure the level shifted GO2 signal with pass-through GO1 signal remaining synchronized. Thus is shown in FIG. 7 by the generated signals VCSEL_ON_AN_N_GO1 501, VCSEL_ON_KA_N_GO1 503, VCSEL_ON_START_N_GO1 505, and VCSEL_ON_STOP_GO1 507 and their GO2 level shifted associated signals VCSEL_ON_AN_N_GO2 701, VCSEL_ON_KA_N_GO2 703, VCSEL_ON_START_N_GO2 705, and VCSEL_ON_STOP_GO2 707.

Furthermore, it is within the driver output stage that the combinatorial logic decodes the encoded phase information, into the set timing requirements, and to summaries, for said method of compensating the path parasitic inductances for high bandwidth pulsed current signaling for laser diode driver.

Various embodiments with different variations have been described here above. It should be noted that those skilled in the art may combine various elements of these various embodiments and variations.

Such alterations, modifications, and improvements are intended to be part of this disclosure, and are intended to be within the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. Aspects of the embodiments can be modified, if necessary to employ techniques of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A laser diode driver circuit comprising:
a first pair of connection paths each coupled to an anode of a laser diode, the first pair of connection paths including a first connection path and a second connection path, a first inductance of the first connection path being substantially equal to a second inductance of the second connection path;
a second pair of connection paths each coupled to a cathode of the laser diode, the second pair of connection paths including a third connection path and a fourth connection path, a third inductance of the third connection path being substantially equal to a fourth inductance of the fourth connection path; and
current driving circuitry, configured to operate such that:
in a first phase, a first current passes through the first pair of connection paths, and a second current passes through the second pair of connection paths, and a potential difference between the cathode and the anode is below a diode activation value;
in a second phase subsequent to the first phase, the second current passes through the first connection path of the first pair of connection paths, the laser diode, and the third connection path of the second pair of connection paths, and the potential difference between the cathode and the anode is above the diode activation value; and
in a third phase subsequent to the second phase, a third current passes through the first connection path of the first pair of connection paths, the laser diode, and the third connection path of the second pair of connection paths, and the potential difference between the cathode and the anode is below the diode activation value.

2. The laser diode driver circuit as claimed in claim 1, wherein the current driving circuitry further includes:
a first switch configured to selectively couple the first connection path of the first pair of connection paths to a high potential supply node,
wherein in the first, second and third phase, the first switch is configured to couple the first connection path of the first pair of connection paths to the high potential supply node.

3. The laser diode driver circuit as claimed in claim 2, wherein the first switch includes a pMOS transistor controlled by a safety control signal.

4. The laser diode driver circuit as claimed claim 2, wherein the current driving circuitry further includes:
a first diode with an anode coupled to the second connection path of the first pair of connection paths and a cathode coupled to the high potential supply node;
a current source node for providing the first current; and
a second switch configured to selectively couple the second connection path of the first pair of connection paths to a low potential supply node via the current source;
wherein in operation:
in the first phase, the second switch is configured to couple the second connection path of the first pair of connection paths to the low potential supply node via the current source so that the first current passes through the first pair of connection paths;
in the second phase, the second switch is configured to uncouple the second connection path of the first pair of connection paths to the low potential supply node via the current source so that the first current passes through the first pair of connection paths, and the diode is configured to provide a shunt current path to shunt current from the second inductance of the second connection path of the first pair of connection paths; and
in the third phase, the second switch is configured to uncouple the second connection path of the first pair of connection paths and to provide, in combination with the first diode, a high impedance node.

5. The laser diode driver circuit as claimed in claim 4, wherein the second switch includes an nMOS transistor controlled by an anode control signal.

6. The laser diode driver circuit as claimed in claim 2, wherein the current driving circuitry further includes:
a third switch configured to selectively couple the fourth connection path of the second pair of connection paths to a high potential supply node; and
a second diode with a cathode coupled to the fourth connection path of the second pair of connection paths and an anode coupled to a low potential supply node;
wherein in operation:
in the first phase, the third switch is configured to couple the fourth connection path of the second pair of connection paths to the high potential supply node;
in the second phase, the third switch is configured to uncouple the fourth connection path of the second pair of connection paths from the high potential supply node such that the second diode is configured to provide a shunt current path to shunt current from the fourth inductance of the fourth connection path of the second pair of connection paths; and
in the third phase, the third switch is configured to uncouple the fourth connection path of the second pair of connection paths, and to provide, in combination with the second diode, a high impedance node.

7. The laser diode driver circuit as claimed in claim 6, wherein the third switch includes a pMOS transistor controlled by a cathode control signal.

8. The laser diode driver circuit as claimed in claim 6, wherein the current driving circuitry further includes:
a current source node for providing the second current and selectively coupling the third connection path of the second pair of connection path to the low potential supply node; and
a fourth switch configured to selectively couple the fourth connection path of the second pair of connection paths to the high potential supply node, wherein in operation:
in the first phase, the current source node is configured to couple the third connection path of the second pair of connection paths to the low potential supply node such that the second current passes through the second pair of connection paths;

in the second phase, the current source node is configured to couple the third connection path of the second pair of connection paths to the low potential supply node such that the second current passes through the first connection path of the first pair of connection paths, the laser diode, and the third connection path of the second pair of connection path; and in the third phase, the fourth switch is configured to selectively couple the third connection path of the second pair of connection paths to the high potential supply node and to provide a snub current path to snub current from the third inductance of the third connection path of the second pair of connection paths.

9. The laser diode driver circuit as claimed in claim 8, wherein the third switch includes a pMOS transistor controlled by a second cathode control signal.

10. The laser diode driver circuit as claimed in claim 1, further comprising:
  timing generating circuitry configured to generate four phase-shifted clock signals;
  a combinational logic configured to receive the four phase-shifted clock signals and to generate phase-defining signals for defining a start of the first phase, a start of the second phase and a start of the third phase, respectively, wherein the phase-defining signals are generated based on one of: rising edges from the four phase-shifted clock signals and falling edges from the four phase-shifted clock signals; and
  a level shifter for receiving the phase-defining signals and for outputting signals for controlling the current driving circuitry in order to operate in the first phase, the second phase and the third phase.

11. The laser diode driver circuit as claimed in claim 10, wherein the timing generating circuitry is configured to generate:
  a first clock signal;
  a second clock signal, which is a first phase-shifted version of the first clock signal;
  a third clock signal, which is a second phase-shifted version of the first clock signal, sequential falling or rising edges of the first clock signal and the third clock signal defining the passing of the first current through the first pair of connection paths, and sequential falling or rising edges of the second clock signal and the third clock signal defining the passing of the second current through the second pair of connection paths; and
  a fourth clock signal, which is a third phase-shifted version of the first clock signal, a falling or a rising edge of the third clock signal and a rising or a falling edge of the fourth clock signal defining the passing of the second current through the first connection path of the first pair of connection path, the laser diode, and the third connection path of the second pair of connection path.

12. The laser diode driver circuit as claimed in claim 1, wherein each connection path includes a connection wiring and a connection pad.

13. A method, comprising:
  operating a laser diode driver circuit in a first phase of driving a laser diode, where:
    a first current passes through a first pair of connection paths of the laser diode driver circuit, the first pair of connection paths being coupled to an anode of the laser diode and including a first connection path having a first inductance and a second connection path having a second inductance that is substantially equal to the first inductance, and
    a second current passes through a second pair of connection paths of the laser diode driver circuit, the second pair of connection paths being coupled to a cathode of the laser diode and including a third connection path having a third inductance and a fourth connection path having a fourth inductance that is substantially equal to the third inductance, and
    a potential difference between the cathode and anode is below a diode activation value;
  operating the laser diode driver circuit in a second phase of driving the laser diode subsequent to the first phase, where:
    the second current passes through the first connection path of the first pair of connection paths, the laser diode and the third connection path of the second pair of connection paths, and
    the potential difference between the cathode and anode is above the diode activation value; and
  operating the laser diode driver circuit in a third phase of driving the laser diode subsequent to the second phase, where:
    a third current passes through the first connection path of the first pair of connection paths, the laser diode and the third connection path of the second pair of connection paths, and
    the potential difference between the cathode and anode is below the diode activation value.

14. The method as claimed in claim 13, further comprising:
  generating four phase shifted clock signals;
  generating phase defining signals for defining a start of the first phase, a start of the second phase and a start of the third phase, the phase defining signals being generated based on one of: rising edges of the four phase shifted clock signals and falling edges of the four phase shifted clock signals; and
  generating output signals based on the phase defining signals for controlling the current driving circuitry to operate in the first phase, the second phase and the third phase.

15. The method as claimed in claim 14, further comprising generating:
  a first clock signal;
  a second clock signal, which is a first phase-shifted version of the first clock signal;
  a third clock signal, which is a second phase-shifted version of the first clock signal, sequential falling or rising edges of the first clock signal and the third clock signal defining the passing of the first current through the first pair of connection paths, and sequential falling or rising edges of the second clock signal and the third clock signal defining the passing of the second current through the second pair of connection path; and
  a fourth clock signal, which is a third phase-shifted version of the first clock signal, a falling or rising edge of the third clock signal and a rising or falling edge of the fourth clock signal defining the passing of the second current through the first connection path of the first pair of connection paths, the laser diode and the third connection path of the second pair of connection path.

16. An apparatus comprising:
a laser diode; and
a laser diode driver coupled to the laser diode, the laser diode driver including:
  a first pair of connection paths coupled to an anode of the laser diode, the first pair of connection paths including a first connection path having a first inductance and a second connection path having a second inductance that is substantially equal to the first inductance;
  a second pair of connection paths coupled to a cathode of the laser diode, the second pair of connection paths including a third connection path having a third inductance and a fourth connection path having a fourth inductance that is substantially equal to the third inductance; and
  current driving circuitry having a timing generating circuitry means, the timing generating circuitry means being configured to generate:
    a first clock signal;
    a second clock signal, which is a first phase-shifted version of the first clock signal;
    a third clock signal, which is a second phase-shifted version of the first clock signal, sequential falling or rising edges of the first clock signal and the third clock signal defining a first current passing through the first pair of connection paths, and sequential falling or rising edges of the second clock signal and the third clock signal defining a second current passing through the second pair of connection paths; and
    a fourth clock signal, which is a third phase-shifted version of the first clock signal, a falling or a rising edge of the third clock signal and a rising or a falling edge of the fourth clock signal defining the second current passing through the first connection path of the first pair of connection paths, the laser diode and the third connection path of the second pair of connection paths.

17. The apparatus as claimed in claim 16, wherein the laser diode driver further includes a first switch configured to selectively couple the first connection path of the first pair of connection paths to a high potential supply node.

18. The apparatus as claimed in claim 17, wherein the first switch includes a pMOS transistor controlled by a safety control signal.

19. The apparatus as claimed claim 17, wherein the laser diode driver further includes:
  a first diode with an anode coupled to the second connection path of the first pair of connection paths and a cathode coupled to the high potential supply node;
  a current source node for providing a current; and
  a second switch configured to selectively couple the second connection path of the first pair of connection paths to a low potential supply node via the current source.

20. The apparatus as claimed in claim 19, wherein the second switch includes an nMOS transistor controlled by an anode control signal.

* * * * *